(12) United States Patent
Yoshida

(10) Patent No.: US 7,359,171 B2
(45) Date of Patent: Apr. 15, 2008

(54) CURRENT LIMITING CIRCUIT AND OUTPUT CIRCUIT INCLUDING THE SAME

(75) Inventor: Mitsuru Yoshida, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 783 days.

(21) Appl. No.: 10/636,861

(22) Filed: Aug. 7, 2003

(65) Prior Publication Data

US 2004/0032701 A1    Feb. 19, 2004

(30) Foreign Application Priority Data

Aug. 16, 2002    (JP)    ............................. 2002-237430

(51) Int. Cl.
*H02H 3/00*    (2006.01)
*H02H 3/08*    (2006.01)
*H02H 9/02*    (2006.01)

(52) U.S. Cl. ...................... 361/93.9; 361/93.1; 361/98

(58) Field of Classification Search ............... 361/93.9, 361/93.1, 98
See application file for complete search history.

(56) References Cited

U.S. PATENT DOCUMENTS 6,294,941 B1 * 9/2001 Yokosawa ................... 327/309

6,369,517 B2 * 4/2002 Song et al. .................. 315/194

FOREIGN PATENT DOCUMENTS

JP          2000-2726         7/2000

* cited by examiner

*Primary Examiner*—Michael Sherry
*Assistant Examiner*—Zeev Kitov
(74) *Attorney, Agent, or Firm*—Darryl G. Walker

(57) ABSTRACT

A current limiting circuit capable of increasing a range of applicable load values is disclosed. An output circuit (100) may include a current limiting circuit. A current limiting circuit may include a voltage detecting circuit (1) and a voltage clamping circuit (2). A voltage detecting circuit (1) may detect a plurality of output voltages (Vout). Voltage clamping circuit (2) may clamp a control terminal of an output transistor (M1) to a plurality of clamped voltages in response to the plurality of detected output voltages (Vout). In this way, an output transistor (M1) may have a plurality of current limitation values as an output voltage (Vout) changes. By doing so, an output circuit (100) may be applicable to a multitude of load (LOAD) values and properly operate without risks of overcurrent or undesired quiescent operating states being entered, as just two examples.

16 Claims, 7 Drawing Sheets

CURRENT LIMITING CIRCUIT AND OUTPUT CIRCUIT INCLUDING THE SAME

TECHNICAL FIELD

The present invention relates generally a current limiting circuit, and more particularly to a current limiting circuit for preventing an overcurrent from flowing through an output transistor.

BACKGROUND OF THE INVENTION

A number of methods can be used for a current limiting circuit in which a power MOS (metal-oxide-semiconductor) transistor is used as an output transistor. In one method, a Zener diode is connected to a gate-source voltage to control a current of an output transistor by limiting the gate-source voltage to the Zener voltage. In another method, several diodes are connected to a gate-source voltage to control a current of an output transistor using the cumulative forward voltages of the diodes as a clamp. In yet another method, such voltage control is carried out using a voltage clamping circuit, or the like.

Referring to FIG. 5, a circuit schematic diagram of an output circuit including a conventional current limiting circuit is set forth and given the general reference character 500. In FIG. 5, a conventional current limiting circuit includes a voltage detecting circuit 501 and a current limiting portion 502.

Voltage detecting circuit 501 includes MOS transistors (M52, M53, and M54) and resistors (R55, R56, R58, and R59). Voltage detecting circuit 501 monitors an output terminal voltage Vout appearing at an output terminal of an output MOS transistor M1. Voltage detecting circuit 501 can be viewed as an overcurrent detecting portion. Current limiting portion 502 includes diodes (D51, D52, and D53). When voltage detecting circuit 501 judges that an overcurrent is being caused to flow through output transistor M1, current limiting portion 502 clamps the gate potential of output transistor M1 to a cumulative forward bias voltage across diodes (D51 to D53) to limit the current flowing through output transistor M1.

The operation of conventional current limiting circuit of output circuit 500 will now be explained with reference to the I-V load curve of FIG. 6 in conjunction with FIG. 5. In FIG. 6, it is assumed that a load LOAD illustrated in FIG. 5 is an incandescent lamp and an input voltage Vin is applied as a flash control signal for the incandescent lamp to an input terminal IN. When input voltage Vin is at a low level (e.g., at 0 volt), MOS transistor M1 is turned off. With MOS transistor M1 turned off, no current flows through MOS transistor M1 and output terminal voltage Vout becomes Vcc (e.g., 10 volts) as can be seen with load curve LOAD CURVE 1 which illustrates the I-V characteristics of the load LOAD.

Next, when signal Vin makes a transition to a high level (e.g., 5 volts), MOS transistor M1 starts to conduct current. The gate of MOS transistor M52 receives a voltage obtained by dividing the output terminal voltage Vout by a voltage divider circuit consisting of resistors (R55 and R56). If the output terminal voltage Vout is assumed to be VM under these conditions (see FIG. 6), when a relationship of R55/(R55+R56)·VM≧Vt52 is established, MOS transistor M52 is turned on (Vt52 is a threshold voltage of MOS transistor M52). That is, when Vout≧VM, MOS transistor M52 is turned on. VM can be expressed as (1+R56/R55)·Vt52. When MOS transistor M52 is turned on, the gate of MOS transistor M53 is pulled low and MOS transistor M53 is turned off. With MOS transistor M53 turned off, the gate of MOS transistor M54 becomes input voltage Vin, in this case a high level. Thus, MOS transistor M54 is turned on and a current flows from input terminal IN through a resistor R510, diodes (D1 to D3), and MOS transistor M54. In this way, the gate of MOS transistor M1 is clamped to the cumulative forward bias voltages of diodes (D1 to D3). Assuming the cumulative forward bias voltages of diodes (D1 to D3) is a constant Vs, then a gate to source voltage (Vgs) of MOS transistor M1 is fixed to Vs when Vout≧VM and a limited current value (Ilim1) flows through transistor M1.

In this state, a resistance Ra of the load LOAD is much larger than an internal resistance Rm1 of MOS transistor M1. Then, at the time when output terminal voltage Vout to be divided (note, the output terminal voltage Vout depends upon the resistances (Ra and Rm1, respectively) of load LOAD and MOS transistor M1) has become lower than VM, MOS transistor M52 is turned off. As a result, MOS transistor M53 is turned on and the gate of MOS transistor M54 is pulled low and MOS transistor M54 is turned off. Consequently, the current path from the gate of MOS transistor M1 through diodes (D1 to D3) is disabled and the gate of NMOS transistor M1 receives the full input voltage Vin applied to input terminal IN. In this way, the internal resistance Rm1 of MOS transistor M1 is further reduced and the output terminal voltage Vout settles to a normal operating point A(Va, Ia) as illustrated in FIG. 6. The normal operating point A(Va, Ia) depends on the resistance Ra of the load LOAD and the resistance Rm1 of MOS transistor M1.

Thus, at a time when a short-circuit failure, or the like, has occurred in a load LOAD, the output terminal voltage Vout is increased up to Vcc. However, when the output terminal voltage Vout reaches the above-mentioned voltage VM, MOS transistor M52 is turned on and thereby MOS transistor M54 is turned on to operate current limiting portion 502 and clamp the gate voltage of MOS transistor M1 and limit an output current. In this way, even if the load LOAD is short-circuited, an overcurrent is prevented from flowing through MOS transistor M1 and breakdown is prevented. Of course, the current limitation value ILIM1 is set so that even when a voltage Vcc is applied to the drain of MOS transistor M1, the source-drain current of MOS transistor M1 falls within a safe operating region.

However, in an output circuit 500 including a conventional current limiting circuit as described above, a problem arises in that when the resistance of the load LOAD is made smaller than Ra, the conventional current limiting circuit does not operate. For example, when the resistance of the load LOAD is a resistance Rb (in this case Rb is ½ Ra), the LOAD LOAD has an I-V characteristic as shown in load curve LOAD CURVE 2 in FIG. 6. Because the load LOAD is halved, the load current (Ib) becomes generally twice as large as Ia. Under this condition, the operating point is illustrated at point B(Vb, Ib). Here it is assumed that even in operating point B(Vb, Ib), the operation of MOS transistor M1 is sufficiently within the safe operating region. In this case, as long as the output circuit 500 is in the normal operating state, resistance Rb should be sufficiently driven.

However, as viewed from the load curve LOAD CURVE2, there is another quiescent state of operation for conventional output circuit 500 at operating point C(Vc, Ilim1). Thus, when the output terminal voltage is intended to go from Vcc to Vb in response to a change in the input voltage Vin, the operating point of the conventional output circuit 500 can settle at point C(Vc, Ilim1) and not reach point B(Vb, Ib). As described above, although the output circuit 500 has the ability to drive the load LOAD having a resistance Rb, the conventional current limiting circuit can become an encumbrance in reaching the desired quiescent operating point.

Consequently, if conventional output circuit 500 is to be capable of correctly driving when a load LOAD has a resistance Rb, the current limitation value Ilim1 must be changed. However, this approach causes the current limiting circuit to be individually provided for every product and a dedicated design needs to be carried out in accordance with the particular load condition. Therefore, costs may be increased.

One approach to solving the above-mentioned problem is disclosed in Japanese Patent Application Laid-Open 2000-2726 A (JP 2000-2726 A). In JP 2000-2726 A, a conventional output circuit is shown in which a plurality of conventional current limiting circuits having different current limitation values is self-contained therein. Any one of these conventional current limiting circuit is adapted to be selected with a switch in accordance with the load condition.

However, in a conventional output circuit as disclosed in JP 2000-2726 A, a plurality of switches must be suitably changed over in accordance with the load used and control of the change over is specifically required. Also, after setting (changing over) the switches, the current limitation value is fixed. Therefore, if the load is then changed, the conventional output circuit of JP 2000-2726 A can have the same problems as discussed above for the conventional output circuit 500 of FIG. 5.

Another conventional output circuit is set forth in a circuit schematic diagram in FIG. 7 and given the general reference character 700.

Conventional output circuit 700 includes a voltage detecting circuit 701, a voltage clamping circuit 702, an output transistor M1, a load LOAD, and a resistor R710.

Resistor R710 is connected between an input terminal IN and a gate of output transistor M1. Output transistor M1 has a source connected to ground GND and a drain connected to a terminal of load LOAD. Load LOAD has another terminal connected to a power supply Vcc. Voltage detecting circuit 701 is connected to receive an input signal from input terminal IN and an output voltage Vout from the drain of output transistor M1 and enables the voltage clamping circuit 702. Voltage clamping circuit 702 is connected between the gate of output transistor M1 and ground GND.

Voltage detecting circuit 701 includes resistors (R75 to R79) and transistors (M72 to M74). Resistors (R75 and R76) are connected in series between the output voltage Vout and ground GND. Resistor R78 and transistor M72 are connected to form an inverter. Resistor R79 and transistor M73 are connected to form an inverter. The inverter (R78 and M72) has an input connected to receive a voltage provided at a tap point connection between resistors (R75 and R76) and an output connected to the inverter (R79 and M73). The inverter (R79 and M73) has an output connected to a gate of transistor M74. Transistor M74 has a source connected to ground GND and a drain connected to a drain of a transistor M75 of voltage clamping circuit 702.

Voltage clamping circuit 702 includes a transistor M75 and resistors (R71 and R72). Resistors (R71 and R72) are connected in series between the gate of output transistor M1 and ground GND. Transistor M75 has a gate connected to a tap point formed at the connection of resistors (R71 and R72) and a drain connected to the gate of output transistor M1.

Voltage detecting circuit 701 is enabled when an input signal at input terminal IN is at a high level. When enabled, voltage detecting circuit 701 detects a voltage level of output voltage Vout. If the output voltage Vout is greater than a predetermined output voltage, transistor M74 is turned on and voltage clamping circuit 702 is enabled to clamp the gate of output transistor M1 to a predetermined voltage. If the output voltage Vout is less than the predetermined output voltage, transistor M74 is turned off and voltage clamping circuit 702 is disabled.

In this way, conventional output circuit 700 provides a load curve characteristic as illustrated in FIG. 6 and having only a current limitation value Ilim1. Thereby, conventional output circuit 700 has the same drawbacks as conventional output circuit 500.

In light of the above, it would be desirable to provide an output circuit in which a value of a limited current flowing through an output transistor may be changed in a plurality of stages in response to a value of an output voltage of the output transistor. In particular, it would be desirable that a value of a limited current may be increased in response to a decrease in an output voltage.

SUMMARY OF THE INVENTION

A current limiting circuit capable of increasing a range of applicable load values is disclosed. An output circuit may include a current limiting circuit. A current limiting circuit may include a voltage detecting circuit and a voltage clamping circuit. A voltage detecting circuit (1) may detect a plurality of output voltages. Voltage clamping circuit may clamp a control terminal of an output transistor to a plurality of clamped voltages in response to the plurality of detected output voltages. In this way, an output transistor may have a plurality of current limitation values as an output voltage changes. By doing so, an output circuit may be applicable to a multitude of load values and properly operate without risks of overcurrent or undesired quiescent operating states being entered, as just two examples.

According to the embodiments, a current limiting circuit may set a current limitation of a current flowing through an output transistor by providing a predetermined one of a plurality of current limitation values in response to an output voltage of the output transistor.

According to another aspect of the embodiments, the current limitation may be increased in response to the output voltage decreasing.

According to another aspect of the embodiments, the current limitation may have a first value when the output voltage is essentially greater than a first voltage and a second value when the output voltage is essentially less than the first voltage.

According to another aspect of the embodiments, the current limiting circuit may be disabled when the output voltage is essentially less than a second voltage less than the first voltage.

According to another aspect of the embodiments, the current limiting circuit may include a voltage clamping circuit. A voltage clamping circuit may be coupled to a control terminal of the output transistor to provide the current limitation by limiting a control terminal voltage applied to the control terminal.

According to one aspect of the embodiments, a current limiting circuit may include a voltage clamping circuit. The voltage clamping circuit may control an output transistor control terminal. The voltage clamping circuit may change the output transistor control terminal to a first voltage level when the output voltage is at a first output voltage and may clamp the output transistor control terminal to a second voltage level when the output voltage is at a second output voltage lower than the first output voltage.

According to another aspect of the embodiments, the voltage clamping circuit may be enabled in response to the output voltage being greater than a predetermined voltage level.

According to another aspect of the embodiments, the predetermined voltage level may be less than the second output voltage.

According to another aspect of the embodiments, the second voltage level may be greater than the first voltage level.

According to another aspect of the embodiments, the current limiting circuit may include a voltage detecting circuit. A voltage detecting circuit may receive the output voltage and enable the voltage clamping circuit to provide the first voltage level when the output voltage is at the first output voltage and provide the second voltage level when the output voltage is at the second output voltage.

According to one aspect of the embodiments, the voltage detecting circuit may turn on a first switch for the voltage clamping circuit to provide the first voltage level and turns on a second switch for the voltage clamping circuit to provide the second voltage level.

According to another aspect of the embodiments, the voltage clamping circuit may include a plurality of diodes. The plurality of diodes may be connected in series between the output transistor control terminal and the first switch. The plurality of diodes may include a diode tap point connected to the second switch to essentially provide a shunt for at least one of the plurality of diodes when turned on.

According to another aspect of the embodiments, the voltage clamping circuit may include a plurality of resistors connected in series between the output transistor control terminal and a reference potential. The second switch may essentially provide a shunt for at least one of the plurality of resistors when turned on.

According to another aspect of the embodiments, the voltage detecting circuit may include a voltage divider. The voltage divider may receive the output voltage and provide a first divider output voltage and a second divider output voltage coupled to control the voltage clamping circuit.

According to another aspect of the embodiments, the output transistor control terminal may receive an input signal. The voltage detecting circuit may be enabled in response to the input signal having a first logic level and disabled in response to the input signal having a second logic level.

According to another aspect of the embodiments, a current limiting circuit may include a voltage detecting circuit and a voltage clamping circuit. The voltage clamping circuit may be activated in response to an input signal to detect an output voltage at an output terminal of an output transistor. A voltage clamping circuit may be connected to a gate terminal of the output transistor and may clamp the gate terminal to a first gate voltage in response to the voltage detecting circuit detecting a first output voltage and to a second gate voltage in response to the voltage detecting circuit detecting a second output voltage.

According to another aspect of the embodiments, the voltage detecting circuit may include a first switch and a second switch. The first switch may activate the voltage clamping circuit in accordance with an output voltage detected. The second switch may change the clamped voltage of the gate terminal from the first gate voltage and the second gate voltage.

According to another aspect of the embodiments, the voltage detecting circuit may change the state of the second switch so that the clamped voltage of the gate terminal is increased in accordance with a decrease of the output voltage.

According to another aspect of the embodiments, the voltage detecting circuit may include a first plurality of voltage division resistors, a first inverter, and a second inverter. The first plurality of voltage division resistors may be connected in series between an output terminal and a reference potential. The first plurality of voltage division resistors may have a plurality of voltage divider tap points. The first inverter may have a first inverter input coupled to a first tap point of the first plurality of voltage division resistors and a first inverter output coupled to a control terminal of the first switch. The second inverter may have a second inverter input coupled to a second tap point of the first plurality of voltage division resistors and a second inverter output coupled to a control terminal of the second switch. The voltage clamping circuit may include a second plurality of voltage division resistors and a reference transistor. The second plurality of voltage division resistors may be connected in series between the gate terminal of the output transistor and the reference potential. The second plurality of voltage division resistors may have at least one voltage divider tap point. The reference transistor may have a reference transistor current path connected between the gate terminal of the output transistor and an output terminal of the first switch and a reference transistor gate terminal coupled to a first tap point of the second plurality of voltage division resistors. The second switch may be connected to essentially provide a shunt for at least one of the second plurality of resistors when turned on.

DETAILED DESCRIPTION OF THE EMBODIMENTS

Various embodiments of the present invention will now be described in detail with reference to a number of drawings.

Figure 1:
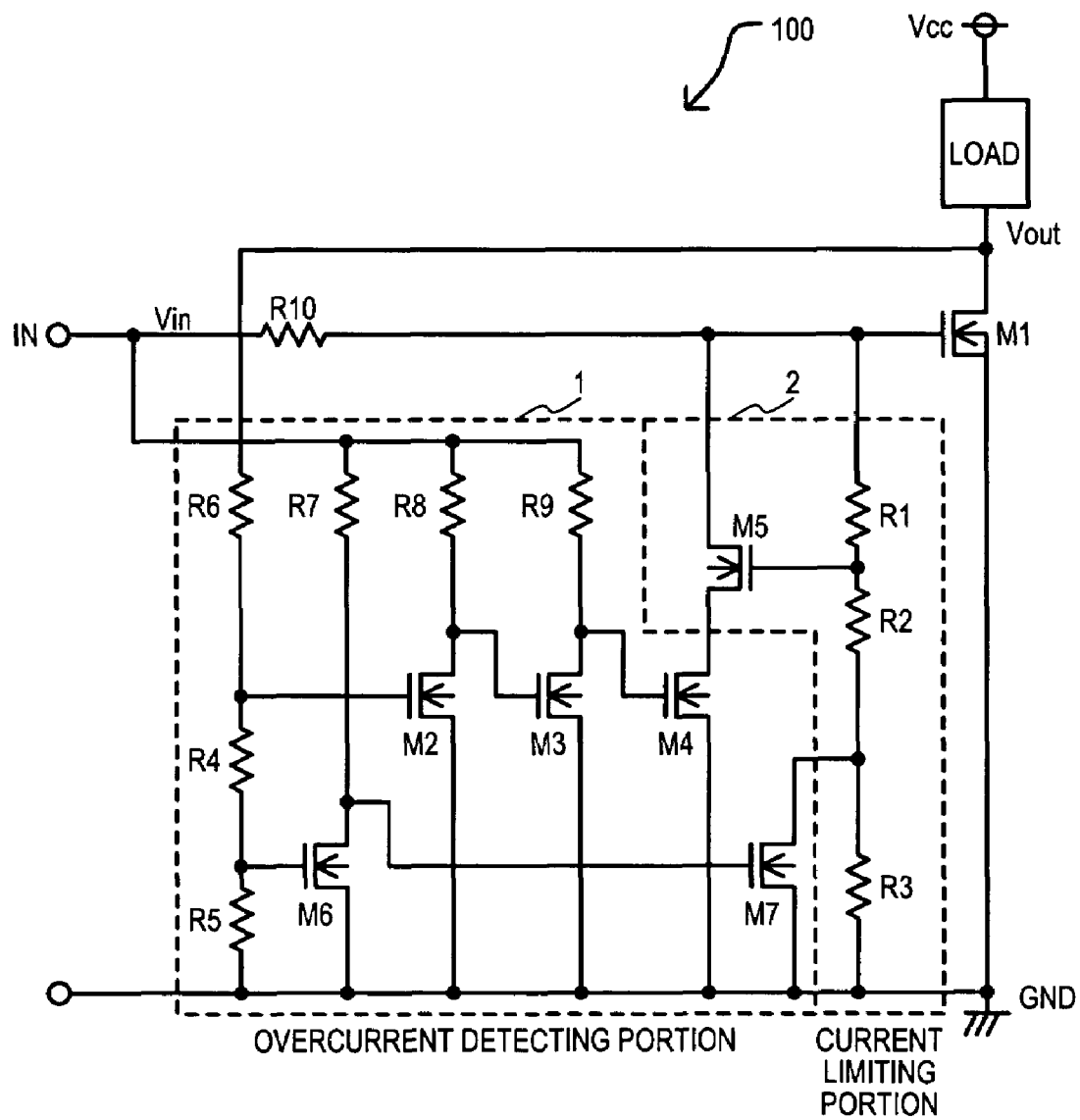
FIG. 1 is a circuit schematic diagram of an output circuit according to an embodiment of the present invention.

Referring now to FIG. 1, a circuit schematic diagram of an output circuit including a current limiting circuit according to an embodiment is set forth and given the general reference character 100.

Output circuit 100 may include a transistor M1, a resistor R10, a voltage detecting circuit 1, and a voltage clamping circuit 2. Transistor M1 may be an n-channel MOSFET (metal-oxide-semiconductor field effect transistor) and may be used as an output power transistor. A load LOAD may be connected between a power supply Vcc and an output terminal at a drain of transistor M1 to produce an output voltage Vout. Transistor M1 may have a source connected to a ground GND. Resistor R10 may be connected between a gate of transistor M1 and an input terminal IN.

Voltage detecting circuit 1 may be connected to the drain of transistor M1 to detect an output voltage Vout. Voltage detecting circuit 1 may be considered as an overcurrent detecting portion for detecting whether or not an overcurrent may be caused to flow through transistor M1. Voltage detecting circuit 1 may be connected to input terminal IN and may essentially be powered by an input signal Vin received at input terminal IN. In this way, when an input signal Vin received at an input terminal IN is at a high level, voltage detecting circuit 1 may be activated and when input signal Vin is at a low level, voltage detecting circuit 1 may be disabled.

Voltage clamping circuit 2 may be activated in response to an output signal provided by voltage detecting circuit 1 to clamp a gate voltage of transistor M1 to a voltage lower than that of input signal Vin. Voltage clamping circuit 2 may be connected as a current limiting portion to the gate of transistor M1. Voltage clamping circuit 2 is configured to generate different clamping voltages in accordance with an output signal provided by voltage detecting circuit 1. That is, voltage clamping circuit 2 may be activated in accordance with a change in an output voltage of voltage detecting circuit 1 to automatically change from a first clamping voltage to a second clamping voltage in accordance with the change in the output voltage. In this way, a value of a limited current flowing through transistor M1 may be changed in accordance with the state of operation.

Voltage detecting circuit 1 may include resistors (R4, R5, R6, R7, R8, and R9) and transistors (M2, M3, M4, M6 and M7). Transistors (M2, M3, M4, M6 and M7) may be n-channel MOSFETs.

Resistor R5 may have a first terminal connected to ground GND and a second terminal connected to a gate of transistor M6. Resistor R4 may have a first terminal connected to a gate of transistor M6 and a second terminal connected to a gate of transistor M2. Resistor R6 may have a first terminal connected to a gate of transistor M2 and a second terminal connected to receive the output voltage Vout at a drain of transistor M1. Resistors (R4, R5, and R6) provide a voltage divider circuit that has voltage divider tap points at each terminal of resistor R4.

Resistor R8 may have a first terminal connected to input terminal IN and a second terminal connected to a drain of transistor M2 and a gate of transistor M3. Transistor M2 may have a gate connected to a voltage divider tap point provided at a common connection node of resistors (R4 and R6) and a source connected to ground GND. Resistor R8 and transistor M2 may form a first inverter.

Resistor R7 may have a first terminal connected to input terminal IN and a second terminal connected to a drain of transistor M6 and a gate of transistor M7. Transistor M6 has a gate connected to a voltage divider tap point provided at a common connection node of resistors (R4 and R5) and a source connected to ground GND. Resistor R7 and transistor M6 may form a second inverter.

Resistor R9 may have a first terminal connected to input terminal IN and a second terminal connected to a drain of transistor M3 and a gate of transistor M4. Transistor M3 has a gate connected receive an output of the first inverter including resistor R8 and transistor M2 and a source connected to ground GND. Resistor R9 and transistor M3 may form a third inverter.

Transistor M4 may have a gate connected to the output of the third inverter including resistor R9 and transistor M3 and a source connected to ground GND. Transistor M4 may be conceptualized as a first switching transistor and may provide a controllable impedance path between ground GND and voltage clamping circuit 2.

Transistor M7 may have a gate connected to the output of the first inverter including resistor R7 and transistor M6 and a source connected to ground GND. Transistor M7 may be conceptualized as a second switching transistor and may provide a controllable impedance path between ground GND and voltage clamping circuit 2.

Voltage clamping circuit 2 may include resistors (R1, R2, and R3) and a transistor M5. Transistor M5 may be a n-channel MOSFET.

Resistor R1 may have a first terminal connected to a gate of transistor M1 and a second terminal connected to a gate of transistor M5. Resistor R2 may have a first terminal connected to a gate of transistor M5 and a second terminal connected to a drain of transistor M7. Resistor R3 may have a first terminal connected to a drain of transistor M7 and a second terminal connected to ground GND. In this way, transistor M7, which provides a second switch transistor, may be connected in parallel with resistor R3. Transistor M5 may have a drain connected to a gate of transistor M1 and a source connected to a drain of transistor M4. In this way, transistor M5 may be connected in series with transistor M4, which can comprise a first switch transistor.

Figure 2:
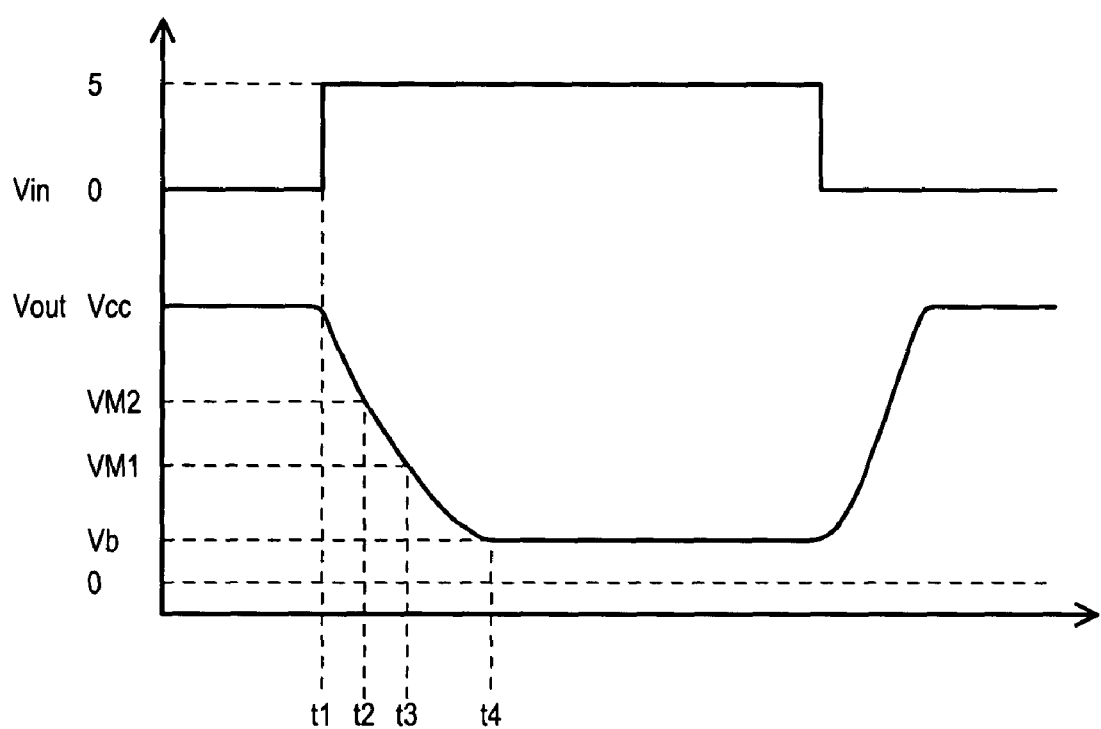
FIG. 2 is timing diagram illustrating the operation of the output circuit of FIG. 1.

The operation of output circuit 100 will now be described with reference to FIG. 2. FIG. 2 is a timing diagram illustrating the operation of output circuit 100 of FIG. 1. FIG. 2 shows an input signal Vin at an input terminal IN and an output voltage Vout at a connection between the drain of transistor M1 and the load LOAD. It is assumed that a load LOAD is a resistance R of an incandescent lamp, for example, and an input signal Vin as shown in FIG. 2 is applied to input terminal IN as a flash control signal of the incandescent lamp.

Referring now to FIG. 2 in conjunction with FIG. 1, when input signal Vin is at a low level (e.g. 0 volt) voltage detecting circuit 1 receives no power and may be disabled. In this condition, transistors M4 and M7 are turned off, thus voltage clamping circuit 2 may not provide a clamping of the voltage at the gate of transistor M1. Thus, the input signal Vin is provided at the gate of transistor M1. With the gate of transistor M1 low, transistor M1 is turned off and in a high impedance state so that essentially no current flows through transistor M1. Therefore, the output voltage Vout becomes essentially equal to the power supply Vcc (e.g., 10 volts).

Then at time t1, the input signal Vin makes a transition to the high level (e.g., 5V), transistor M1 turns on and begins to conduct current. Here, the voltage applied to the gate of transistor M2 of voltage detecting circuit 1 is $(R4+R5)/(R4+R5+R6) \cdot Vout$. During the time period that this voltage is greater than a threshold voltage Vt2 of transistor M2, transistor M2 is turned on and in a relatively low impedance state. This occurs as long as the following equation is satisfied.

$$(R4+R5)/(R4+R5+R6) \cdot Vout \geq Vt2 \tag{1}$$

If Vout at this time is assumed to be VM1, the following equation is obtained.

$$Vout \geq (1+(R6/(R4+R5))) \cdot Vt2 = VM1 \tag{2}$$

With transistor M2 turned on, the gate of transistor M3 is pulled low and transistor M3 is turned off. With transistor M3 turned off, the gate of transistor M4 is pulled high toward the input signal Vin level through resistor R9. Thus, transistor M4 is turned on. In this way, a current path from the gate of transistor M1 through transistor M5 of voltage clamping circuit 2 is enabled. Transistor M4 may activate voltage clamping circuit 2 when turned on and may disable voltage clamping circuit 2 when turned off. Transistor M4 may be turned on or turned off in accordance with the voltage level of output voltage Vout when the input signal Vin is at a high level.

Transistor M6 may receive a gate voltage from the voltage divider tap point at a common connection of resistors (R4 and R5). In this way, transistor M6 may receive a gate voltage of Vout·R5/(R4+R5+R6). If the voltage level of output voltage Vout that is required to turn on transistor M6 is assumed to be VM2, then VM2 can be expressed as follows.

$$Vout \geq (1+(R4+R6)/(R4+R5+R6)) \cdot Vt6 \qquad (3)$$

Vt6 is a threshold voltage of transistor M6. When transistor M6 is turned on, the gate of transistor M7 is pulled low and transistor M7 may be turned off. However, if output voltage Vout is less than VM2, transistor M6 is turned off. With transistor M6 turned off, a voltage level essentially equal to the input signal Vin may be provided to a gate of transistor M7 and transistor M7 may be turned on.

When transistor M7 is turned on, resistor R3 may be essentially shunted through transistor M7. In this way, a voltage applied to a gate of transistor M5 may be at a lower voltage level.

As described above according to the embodiment of FIG. 1, when input signal Vin having a high level is applied to input terminal IN, voltage detection circuit 1 may be enabled. When voltage detection circuit 1 is enabled, transistor M4 may be turned on when the output voltage Vout is greater or equal to VM1. With transistor M4 turned on, voltage clamping circuit 2 may be enabled. When the output voltage Vout is greater than or equal to VM2, transistor M7 may be turned off. However, when the output voltage Vout is less than VM2, transistor M7 may be turned on. It should be noted VM1≦VM2.

Figure 3:
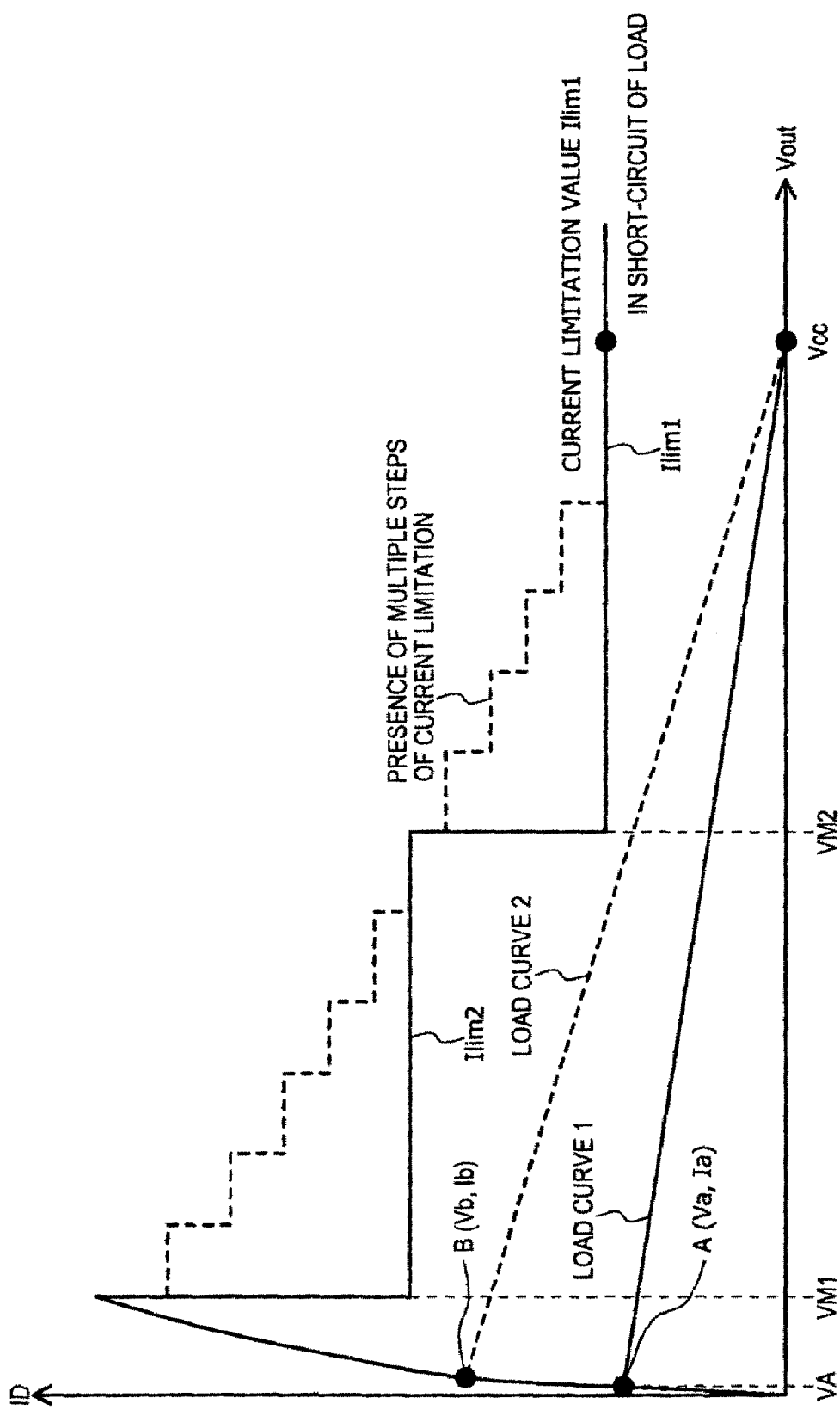
FIG. 3 is a load curve illustrating the operation of an output circuit according to the present invention.

The operation of output circuit 100 as described above will now be further described with reference to the timing diagram of FIG. 2 and the I-V load curve of FIG. 3. FIG. 3 is an I-V load curve for the output circuit 100 of FIG. 1.

When input signal Vin is low, transistor M1 is turned off and voltage detecting circuit 1 is disabled. At the time the input signal Vin transitions from a low level to a high level as illustrated at time t1 of FIG. 2, transistor M1 may turn on and the output voltage Vout begins to drop. Also, at this time, voltage detection circuit 1 may be enabled. As long as Vout≧VM2 as shown when t1≦t≦t2, transistors (M3 and M7) are turned off and transistors (M2, M4 and M6) are turned on. With transistor M7 turned off and transistor M4 turned on, the output voltage of voltage clamping circuit 2 at the gate of transistor M1 assumed to be VGS1 may follow the following expression.

$$VGS1=(1+(R1/(R2+R3)) \cdot Vt5 \qquad (4)$$

With the gate voltage of transistor M1 being clamped to VGS1 and transistor M1 operating in the saturation region, the current flowing through transistor M1 may be limited to a current Ilim1 as illustrated in FIG. 3. It is noted that current Ilim1 depends on VGS1.

If a resistance Rb of load LOAD is much larger than an internal resistance Rm1 of transistor M1 output voltage Vout continues to decrease. Then, when VM1≦Vout≦VM2 as shown when t2≦t≦t3 in FIG. 2, transistor M6 may turn off and transistor M7 may turn on. With transistor M7 turned on, resistor R3 may be essentially shunted. At this time, the output voltage of voltage clamping circuit 2 applied to the gate of transistor M1 may depend on resistors (R1 and R2) and transistor M5 and may be expressed as VGS2 by the following expression.

$$VGS2=(1+(R1/R2)) \cdot Vt5 \qquad (5)$$

With the gate voltage of transistor M1 being clamped to VGS2 and transistor M1 operating in the saturation region, the current flowing through transistor M1 may be limited to a current Ilim2 as illustrated in FIG. 3. It is noted that current Ilim2 depends on VGS2.

In this way, transistor M7 may provide a control switch for changing an output clamping voltage of voltage clamping circuit 2 from a first voltage to a second voltage in accordance with the output voltage Vout of output circuit 100. Because the potential of VGS2 is larger than the potential of VGS1, a current limitation value Ilim2 may be larger than a current limitation value Ilim1 which may flow through transistor M1.

It is noted in accordance with equations 4 and 5, that a clamped voltage of transistor M1 may be proportional to a threshold voltage (Vt5) of transistor M5. In this way, transistor M5 may be conceptualized as a reference transistor.

As described above, because the limited current may be automatically increased as the output voltage Vout is decreased, a load curve LOAD CURVE 2 may not intersect with the current limitation line and output voltage Vout may decrease without settling into an undesired quiescent point. Then at a time when output voltage Vout<VM1 as shown at time t3, transistor M2 may turn off. With transistor M2 turned off, the gate of transistor M3 may receive a high level and may turn on. With transistor M3 turned on, the gate of transistor M4 may be pulled low and transistor M4 may be turned off. With transistor M4 turned off, a current path from the gate of transistor M1 through series connected transistors (M4 and M5) may be eliminated. In this way, voltage clamping circuit 2 may be disabled.

At the time when voltage clamping circuit 2 is disabled, a voltage value which is obtained at a voltage divider tap point (connection node of resistors R10 and R1) by dividing the voltage of input signal Vin by a voltage divider formed by resistors (R10, R1, and R2) may be applied to the gate of transistor M1. It is understood that resistance values of resistors (R10, R1, and R2) may be set so that the voltage applied to the gate of transistor M1 at this time is larger than VGS2 and may be nearly the voltage of the input signal Vin. In such a manner, because input signal Vin is substantially applied to transistor M1 the output voltage Vout may transition to a normal quiescent operating point B(Vb, Ib) depending on a resistance Rb of load LOAD and an internal resistance Rm1 of transistor M1. It is noted that, according to the embodiment of FIG. 1, the output voltage Vout may transition to a normal quiescent operating point without inadvertently settling into an undesired quiescent point as compared to a conventional output circuit.

Thereafter, if a short circuit failure occurs in the load LOAD, the output voltage Vout may make a substantial transition to Vcc. In response to this situation, voltage detecting circuit 1 may turn on transistor M4. In this way, voltage clamping circuit 2 may be activated or enabled. Also, voltage detecting circuit 1 may turn off transistor M7 so the gate of transistor M1 may be clamped to VGS1 by voltage clamping circuit 2. In such a way, the current of transistor M1 may be limited to the smallest current limitation value Ilim1 to protect the apparatus in the abnormal state.

The gate of transistor M1 may be conceptualized as an output transistor control terminal.

While in the above-mentioned embodiment, a current limitation value having two stepped values is disclosed, a current limitation value having multiple steps greater than two may also be provided as illustrated by the dashed line of FIG. 3. It is to be understood that if a current limitation value having multiple steps greater than two is provided, the range of resistance values of drivable load LOAD may be further widened. Of course, the lower current limitation value may be set so that the operation of transistor M1 falls with a safe current value when, for example, a short circuit of the load LOAD or the like occurs.

Figure 4:
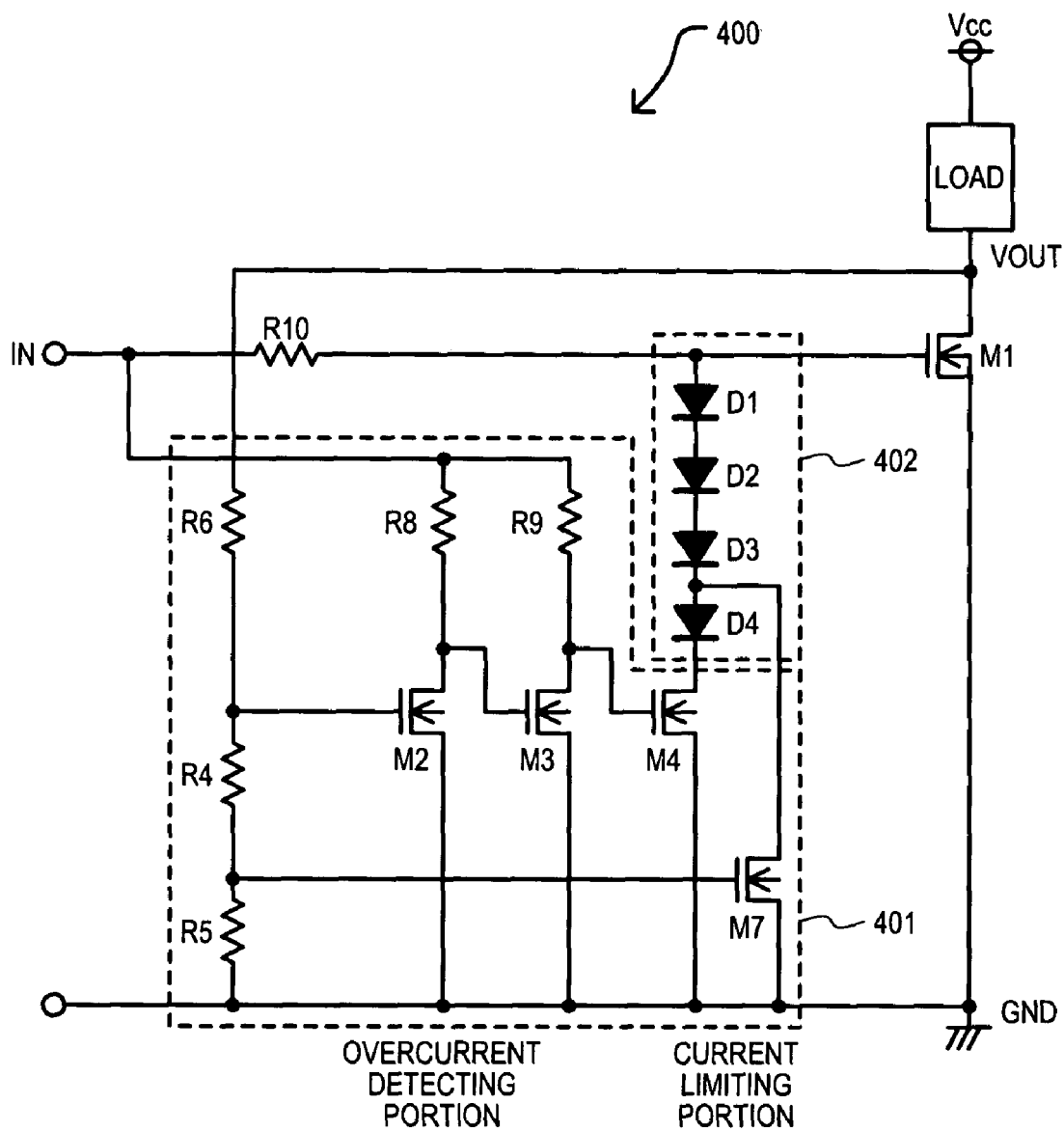
FIG. 4 is circuit schematic diagram of an output circuit according to another embodiment.
Figure 5:
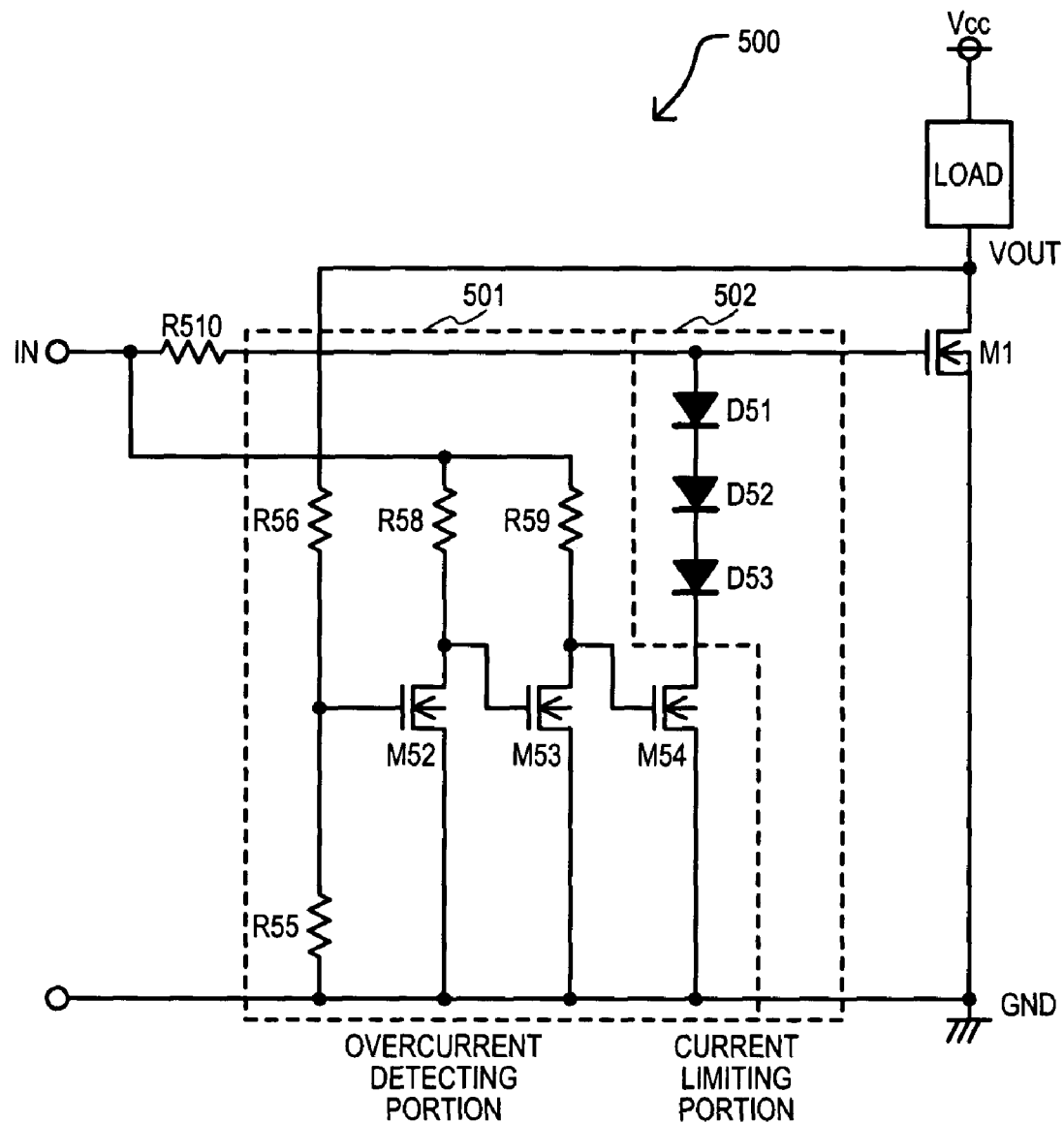
FIG. 5 is a circuit schematic diagram of a conventional output circuit.
Figure 6:
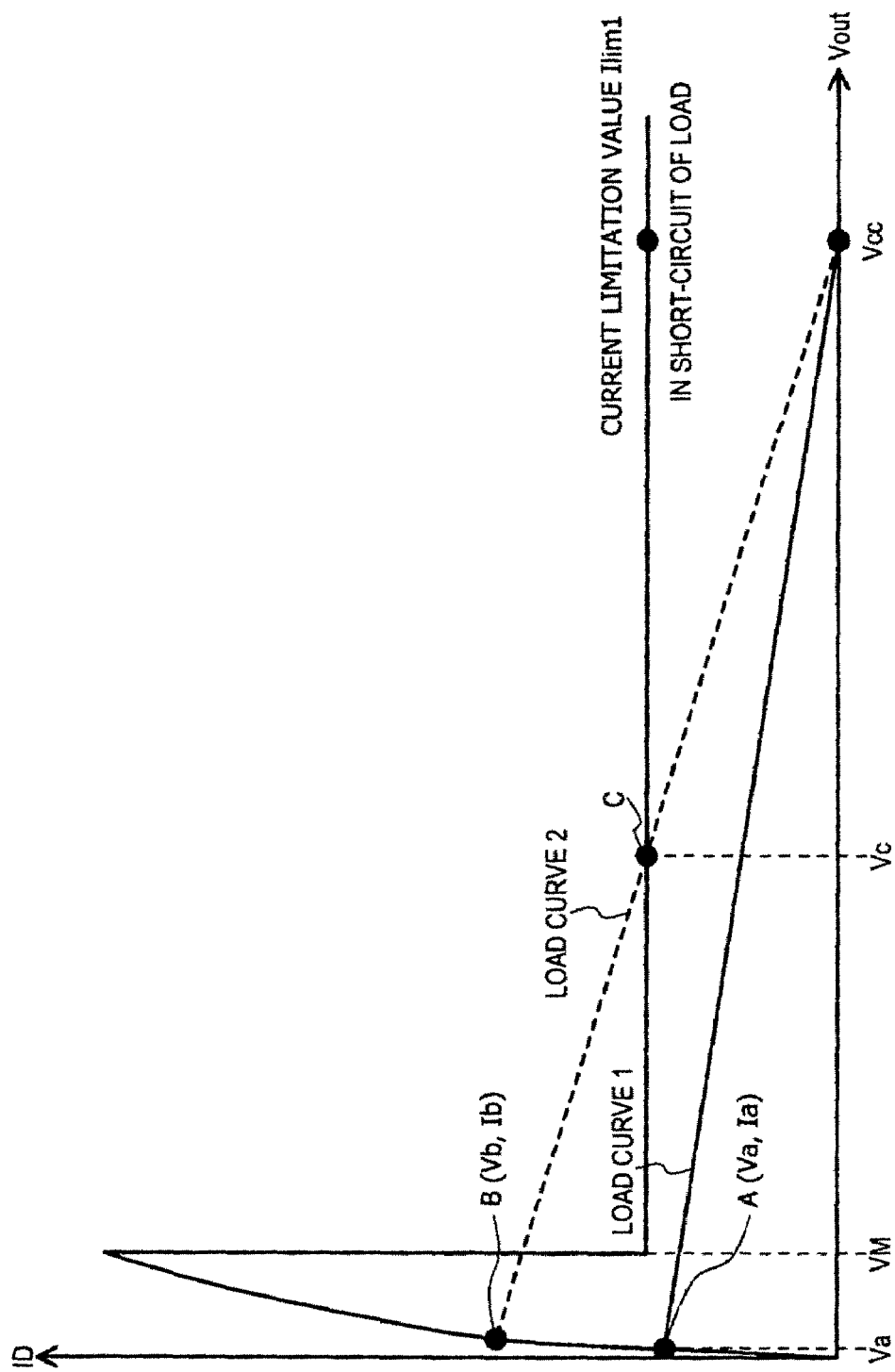
FIG. 6 is a load curve illustrating the operation of a conventional output circuit.
Figure 7:
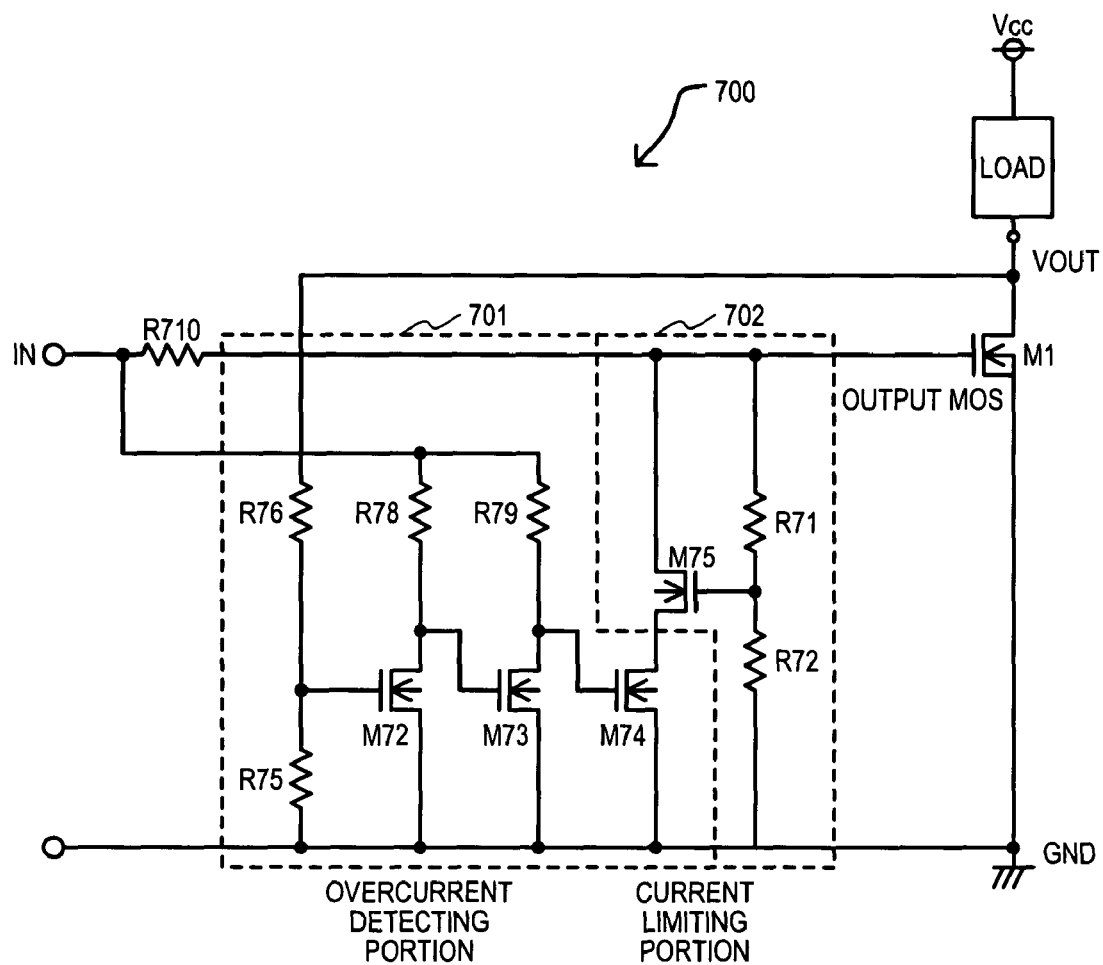
FIG. 7 is a circuit schematic diagram of a conventional output circuit.

Referring now to FIG. 4, a circuit schematic diagram of an output circuit including a current limiting circuit according to another embodiment is set forth and given the general reference character 400.

Output circuit 400 may include a transistor M1 a resistor R10, a voltage detecting circuit 401, and a voltage clamping circuit 402.

Voltage detecting circuit 401 of FIG. 4 may differ from voltage detecting circuit 1 of FIG. 1 in that transistor M6 and resistor R7 forming the second inverter may be eliminated. Instead, transistor M7 may have a gate connected to a voltage divider tap point provided at a common connection node of resistors (R4 and R5).

Voltage clamping circuit 402 may include diodes (D1, D2, D3, and D4). Diode D1 may have an anode connected to a gate of transistor M1 and a cathode connected to an anode of diode D2. Diode D2 may have a cathode connected to an anode of diode D3. Diode D3 may have a cathode connected to an anode of diode D4 and a drain of transistor M7. Diode D4 may have a cathode connected to a drain of transistor M4.

The operation of output circuit 400 will now be briefly discussed. The operation of the turning on and turning off of transistor M4 may be essentially the same as in the operation of output circuit 100 discussed above. When the output voltage Vout is essentially greater than or equal to VM1, transistor M4 may be turned on. When the output voltage Vout is essentially less than VM1, transistor M4 may be turned off.

However, the operation of voltage detecting circuit 401 may differ from the operation of voltage detecting circuit 1 in that transistor M7 may turn on when the output voltage Vout is greater than or equal to VM2 and transistor M7 may turn off when the output voltage Vout is less than VM2.

Thus, when Vout≧VM2, transistor M7 may be turned on and transistor M4 may be turned on. With transistor M7 turned on, diode D4 may be essentially shunted. In this way, the gate of transistor M1 may be clamped to essentially a cumulative forward bias voltage of three diodes (D1 to D3) and transistor M1 may have a first current limitation value, for example Ilim1.

Then, when VM1≦Vout≦VM2, transistor M4 may be turned on and transistor M7 may be turned off. In this way, the gate of transistor M1 may be clamped to essentially a cumulative forward bias voltage of four diodes (D1 to D4) and transistor M1 may have a second current limitation value, for example Ilim2.

Then, when Vout<VM1, transistors (M4 and M7) may be turned off. In this way, the gate of transistor M1 may receive essentially the voltage of input signal Vin.

It is understood that the embodiments described above are exemplary and the present invention should not be limited to those embodiments. Specific structures should not be limited to the described embodiments.

For example, a positive power supply is provided to a load LOAD. In this case, an n-channel MOSFET may be used as an output transistor (transistor M1). However, as just one example, a p-channel MOSFET may be used as an output transistor. In this case, the output transistor may have a source connected to a positive power supply and a load may be connected to ground as one example. Alternatively, the output transistor may have a source connected to a ground and a load may be connected to negative supply as another example. When a p-channel MOSFET is used as an output transistor, a logic low value of input signal Vin may be used to enable the voltage detecting circuit.

As described above according to the embodiments, a value of a limited current flowing through an output transistor may be increased in accordance with a decrease in an output voltage provided at a connection between the output transistor and a load. Thus, even if an output circuit is used with a wide range of loads without an external load adjustment control, the output voltage may transition to desired quiescent states without inadvertently settling into an undesired quiescent state due to load lines intersecting with current limitation lines. In this way, one output circuit may be versatile to function with a large number of loads and the necessity of designing a load specific output circuit for each differing load may become unnecessary. Also, a need of providing, for example an external load adjustment control to an output circuit to be used with differing loads may become unnecessary.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A current limiting circuit that sets a current limitation of a current flowing through an output transistor by providing a predetermined one of a plurality of current limitation values in response to an output voltage of the output transistor, the current limiting circuit including a voltage clamping circuit coupled to a control terminal of the output transistor to provide the plurality of current limitation values by limiting a control terminal voltage applied to the control terminal.

2. The current limiting circuit of claim 1, wherein:
the current limitation is increased in response to the output voltage decreasing.

3. The current limiting circuit of claim 1, wherein:
the current limitation has a first value when the output voltage is essentially greater than a first voltage and a second value when the output voltage is essentially less than the first voltage.

4. The current limiting circuit of claim 3, wherein:
the first value is less than the second value.

5. The current limiting circuit of claim 4, wherein:
the voltage clamping circuit is disabled when the output voltage is essentially less than a second voltage less than the first voltage.

6. A current limiting circuit, comprising:
a voltage clamping circuit controlling an output transistor control terminal voltage wherein
the voltage clamping circuit clamps the output transistor control terminal to a first voltage level when the output voltage is at a first output voltage and clamps the output transistor control terminal to a second voltage level when the output voltage is at a second output voltage lower than the first output voltages and
the second voltage level is greater than the first voltage level.

7. The current limiting circuit of claim 6, wherein:
the voltage clamping circuit is enabled in response to the output voltage being greater than a predetermined voltage level.

8. The current limiting circuit of claim 7, wherein:
the predetermined voltage level is less than the second output voltage.

9. The current limiting circuit of claim 6, further including:
a voltage detecting circuit coupled to receive the output voltage and enables the voltage clamping circuit to provide the first voltage level when the output voltage is at the first output voltage and provide the second voltage level when the output voltage is at the second output voltage.

10. The current limiting circuit of claim 9, further including:
the voltage detecting circuit turns on a first switch for the voltage clamping circuit to provide the first voltage level and turns on a second switch for the voltage clamping circuit to provide the second voltage level.

11. The current limiting circuit of claim 10, wherein:
the voltage clamping circuit includes a plurality of diodes connected in series between the output transistor control terminal and the first switch, the plurality of diodes includes a diode tap point coupled to the second switch and the second switch essentially provides a shunt for at least one of the plurality of diodes when turned on.

12. The current limiting circuit claim 10, wherein:
the voltage clamping circuit includes a plurality of resistors connected in series between the output transistor control terminal and a reference potential and the second switch essentially provides a shunt for at least one of the plurality of resistors when turned on.

13. The current limiting circuit of claim 9, further including:
the voltage detecting circuit includes a voltage divider coupled to receive the output voltage and provide a first divider output voltage and a second divider output voltage coupled to control the voltage clamping circuit.

14. The current limiting circuit of claim 9, wherein:
the output transistor control terminal is coupled to receive an input signal; and
the voltage detecting circuit is enabled in response to the input signal having a first logic level and disabled in response to the input signal having a second logic level.

15. A current limiting circuit, including:
a voltage detecting circuit activated in response to an input signal to detect an output voltage at an output terminal of an output transistor; and
a voltage clamping circuit coupled to a gate terminal of the output transistor and clamping the gate terminal to a first gate voltage in response to the voltage detecting circuit detecting a first output voltage and to a second gate voltage in response to the voltage detecting circuit detecting a second output voltage wherein
the voltage detecting circuit includes a first switch for activating the voltage clamping circuit in accordance with an output voltage detected and a second switch for changing the clamped voltage of the gate terminal from the first gate voltage to the second gate voltage and the voltage detecting circuit changes the state of the second switch so that the clamped voltage of the gate terminal is increased in accordance with a decrease of the output voltage.

16. The current limiting circuit of claim 15, wherein:
the voltage detecting circuit further includes
a first plurality of voltage division resistors connected in series between the output terminal and a reference potential, the first plurality of voltage division resistors having a plurality of voltage divider tap points;
a first inverter having a first inverter input coupled to a first tap point of the first plurality of voltage division resistors and a first inverter output coupled to a control terminal of the first switch; and
a second inverter having a second inverter input coupled to a second tap point of the first plurality of voltage division resistors and a second inverter output coupled to a control terminal of the second switch; the voltage clamping circuit includes
a second plurality of voltage division resistors connected in series between the gate terminal of the output transistor and the reference potential, the second plurality of voltage division resistors having at least one voltage divider tap point;
a reference transistor having a reference transistor current path coupled between the gate terminal of the output transistor and an output terminal of the first switch and a reference transistor gate terminal coupled to a first tap point of the second plurality of voltage division resistors; and
the second switch is connected to essentially provide a shunt for at least one of the second plurality of resistors when turned on.

* * * * *